(12) United States Patent
Kanda et al.

(10) Patent No.: US 6,353,330 B1
(45) Date of Patent: Mar. 5, 2002

(54) SINGLE-FLUX-QUANTUM DIGITAL DEVICE

(75) Inventors: Akinobu Kanda; Koji Ishibashi; Yoshinobu Aoyagi; Takuo Sugano, all of Saitama-Ken (JP)

(73) Assignee: Riken, Wako (JP)

( * ) Notice: Subject to any disclaimer, the term of this patent is extended or adjusted under 35 U.S.C. 154(b) by 0 days.

(21) Appl. No.: 09/506,905

(22) Filed: Feb. 18, 2000

(30) Foreign Application Priority Data

Feb. 18, 1999 (JP) ............................................. 11-040141

(51) Int. Cl.⁷ ........................ H03K 19/195; H03K 17/92
(52) U.S. Cl. ............................................. 326/1; 327/366
(58) Field of Search ................................ 326/1–3, 6–7; 327/366, 370, 373, 527, 528

(56) References Cited

U.S. PATENT DOCUMENTS 4,567,383 A * 1/1986 Goto et al. .................. 327/528

FOREIGN PATENT DOCUMENTS

JP        411154867 A * 6/1999

OTHER PUBLICATIONS

Kanda et al, Extended Abstracts of the . . . , "Characterization of Small Superconducting Rings and Its . . . ", pp. 208–209, 1998.

K.K. Likharev, The New Superconducting Electronics, "Rapid Single–Flux–Quantum Logic", pp. 423–439, 1993.

Kanda et al, Extended Abstracts of the 59ᵗʰ Autumn Meeting, "Voltage–controlled single–flux–quantum . . . ", pp. 7 pgs., 1998.

Kanda et al, Extended Abstracts of the 1998 International Conf. "Characterization of Small . . . ", 11 pgs., 1998.

* cited by examiner

Primary Examiner—Michael Tokar
Assistant Examiner—James H. Cho
(74) Attorney, Agent, or Firm—Jacobson Holman, PLLC

(57) ABSTRACT

A single-flux-quantum digital device includes a first superconducting line extended in a large ring, a second superconducting line connected to the first superconducting line, a superconducting single electron transistor for regulating a supercurrent flowing through the second superconducting line, and a small tunnel junction device for detecting a change in the supercurrent flowing through the first superconducting line. The first superconducting line is extended in a large ring. The second superconducting line divides the large ring into two small rings which are substantially the same in shape and area. The small tunnel junction device is connected to a point where the first and the second superconducting line are joined.

6 Claims, 4 Drawing Sheets

SINGLE-FLUX-QUANTUM DIGITAL DEVICE

BACKGROUND OF THE INVENTION

1. Field of the Invention

The present invention relates to a digital device having superconductors and, more particularly, to single-flux-quantum digital device employing single quanta of magnetic flux.

2. Description of the Related Art

A Josephson-junction device having superconductors is known to be a digital device capable of fast operation at low power consumption. As shown in FIG. 5, the Josephson-junction device is formed by connecting two superconductors 21 by a thin insulating film 22. Cooper pairs that cause supercurrent pass the insulating film 22 due to the tunneling effect according to the quantum theory. The principle of operation of the Josephson-junction device is divided roughly into a voltage-state logic (latching logic) and a flux-state logic (single-flux-quantum logic).

The voltage-state logic uses the strong nonlinear current-voltage characteristic of the Josephson-junction device. As shown in FIG. 6, the current-voltage characteristics of the Josephson-junction device has a state where voltage if zero because Cooper pairs move by the tunneling effect. Referring to FIG. 6, when current increases from zero at the origin O, a supercurrent increases along a path Oa while voltage remains zero (superconducting state). Since there is a limit to the intensity of the supercurrent that flows through the Josephson-junction device, the supercurrent reaches a critical current $I_0$ at the point A and the state switches suddenly to a point B for a voltage state. Thereafter, the current increases monotonously with the voltage to a point C. When the current is decreased from the point C, the current-voltage characteristic varies along a path CBDO and any zero-voltage state does not appear (hysteretic characteristic). Therefore, in the Josephson-junction device, two discrete logic states can be created by supplying a supercurrent below the critical current $I_0$ to the Josephson-junction device in the initial state and temporarily increasing the current beyond the critical current $I_0$ for transition from the initial state to the voltage state. Once the Josephson-junction device is set in the voltage state by an input signal, the Josephson-junction device remains in the voltage state and is unable to return to the superconducting state even if the input signal is removed (latching characteristic).

The flux-state logic is a logic using the nonlinear current-phase characteristic of the Josephson-junction device. The relation between supercurrent I and phase difference $\phi$ in the Josephson-junction device is expressed by:

$$I = I_0 \sin \phi \quad (1)$$

where $I_0$ is critical supercurrent and $\phi$ is the phase difference between the wave functions of the superconductors 21 in the opposite sides of the insulator 22.

Since there is a limit to the supercurrent that flows through the Josephson-junction device, the phase state changes instantly upon the increase of the supercurrent beyond the critical supercurrent $I_0$. Therefore, in the Josephson-junction device, the two discrete logic states can be created by supplying a supercurrent below the critical current $I_0$ to the Josephson-junction device in the initial state and temporarily increasing the current beyond the critical current $I_0$ in response to an input signal for transition from the phase state.

Methods of temporarily increasing the supercurrent to the critical supercurrent $I_0$ or above in response to an input signal to realize the voltage-state logic or the flux-state logic are divided into those of a field-controlled (flux coupling) driving system and those of a current-controlled (direct coupling) driving system. The method of the field-controlled driving system passes a current (input current) through a coil disposed near the Josephson-junction device to reduce the critical supercurrent of the Josephson-junction device by applying a magnetic field to the Josephson-junction device. The method of the current-controlled driving system passes a current (input current) directly through the Josephson-junction device to increase the current flowing through the Josephson-junction device to the critical supercurrent $I_0$ or above.

In the Josephson-junction device of the voltage-state logic or the flux-state logic, the current flowing through the Josephson-junction device is increased temporarily to the critical supercurrent $I_0$ or above in response to the input current by the method of the field-controlled or the current-controlled system to realize the two discrete logic states. However, driving of the Josephson-junction device by either the methods of the field-controlled system or the current-controlled system has the following drawbacks.

A first problem is that, since the Josephson-junction device is a two-terminal device, a special contrivance is necessary to isolate the input and the output from each other. This drawback is particularly significant when the Josephson-junction device is driven by the driving method of the current-controlled system that passes the input current directly through the Josephson-junction device and the Josephson-junction device must be provided with a special circuit, such as an isolator for isolating the input and the output from each other. The input and the output of the Josephson-junction device can be relatively easily isolated from each other when the Josephson-junction device is driven by the driving method of the field-controlled system because all the input current supplied to the coil flows into the ground. However, an additional space is necessary to install the coil and a neighboring Josephson-junction device must be widely spaced apart from the coil so that the neighboring Josephson-junction device may not be affected by the magnetic field created by the coil. Accordingly, it is difficult to construct an integrated circuit in a high level of integration when Josephson-junction devices are employed.

A second problem is that, since the input signal is a current, the Josephson-junction device needs an operating system different from that of the current semiconductor devices and the Josephson-junction device has problems associated with fan-out and load inductance.

A third problem is that, since the Josephson-junction device has a hysteretic current-voltage characteristic, the Josephson-junction device of the voltage-state logic must be returned to a zero-voltage state. Returning to the zero-voltage state can be achieved by a previously proposed method that uses an AC-driven circuit or a previously proposed method that uses a DC-driven circuit. These methods, however, causes many problems in implementation and circuit speed. A Josephson-junction device not having any hysteretic characteristic and using a RSFQ (rapid single-flux-quantum) logic has been proposed by Likharev et al. in 1991. However, even the RSFQ logic is unable to solve the first and the second problem.

SUMMARY OF THE INVENTION

The present invention has been made considering those problems and it is therefore an object of the present invention to solve the foregoing first to third problems and to provide a three-terminal single-flux-quantum digital device capable of raising the level of integration, dealing with input and output voltage signals, not having a hysteretic characteristic and capable of easily realizing circuit design similar to those of conventional semiconductor devices.

According to the present invention, a single-flux-quantum digital device (hereinafter referred to as "SFQ digital device") comprises a first superconducting line extended in a large ring, a second superconducting line connected to the first superconducting line so as to divide the large ring of the first superconducting line into two small rings, a switching device for regulating a supercurrent flowing through the second superconducting line, and a detecting device for detecting a change in the supercurrent flowing through the first superconducting line.

In the SFQ digital device according to the present invention, the switching device increases or decreases the supercurrent flowing through the second superconducting line to increase or decrease the supercurrent flowing through the first superconducting line. This change in the supercurrent is detected through the detection of a change in the output voltage of the detecting device to realize the basic logic of a logic circuit or a storage circuit by using the relation between the input and the output signal. Particularly, the SFQ digital device according to the present invention is a three-terminal device capable of raising the level of integration, and dealing with input and output voltage signals, not having a hysteretic characteristic and facilitating circuit designing similarly to the conventional semiconductor devices.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
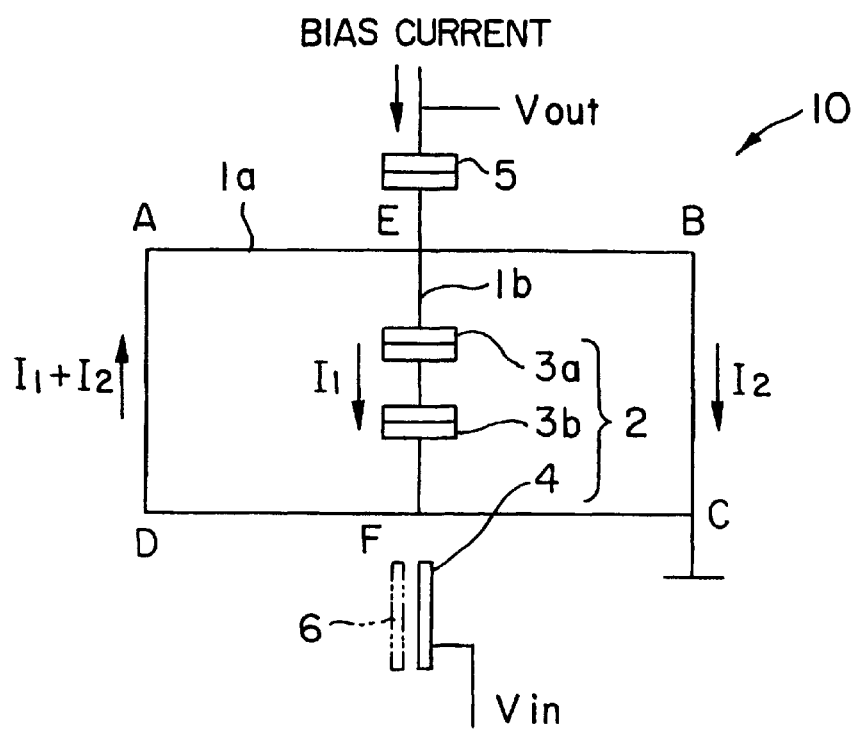
FIG. 1 is a basic circuit diagram of a SFQ digital device in a preferred embodiment according to the present invention.

FIGS. 1, 2, 3A and 3B show a SFQ digital device in a preferred embodiment according to the present invention. Referring to FIG. 1, a SFQ digital device 10 has a ring of a first superconducting line 1a, a second superconducting line 1b connected to the first superconducting line 1a, a superconducting single electron transistor (SET) 2, i.e., a switching device, for regulating a supercurrent flowing through the second superconducting line 1b, and a small tunnel junction device 5, i.e., a detecting device, for detecting a change in supercurrent flowing through the first superconducting line 1a.

The first superconducting line 1a forms a large ring ABCDA. The second superconducting line 1b divides the large ring ABCDA into two small rings, i.e., a first small ring AEFDA and a second small ring EBCFE. Both the first superconducting line 1a and the second superconducting line 1b are formed in a width far smaller than penetration depth so that supercurrent is distributed uniformly in their sections. The two small rings AEFDA and EBCFE are substantially the same in shape and area. The small tunnel junction device 5, i.e., the detecting device, is connected to the joint E of the first superconducting line 1a and the second superconducting line 1b.

The superconducting SET 2 is a switching device using single electron charging effect and varies the supercurrent flowing through the second superconducting line 1b according to the variation of voltage. More concretely, the superconducting SET 2 comprises a pair of superconducting small tunnel junctions 3a and 3b, and a gate electrode 4 disposed near the superconducting small tunnel junctions 3a and 3b. Gate voltage $V_{in}$ applied to the gate electrode 4 is varied to increase or decrease the supercurrent flowing through the superconducting small tunnel junctions 3a and 3b, i.e., the supercurrent flowing through the second superconducting line 1b. Each of the superconducting small tunnel junctions 3a and 3b is formed by sandwiching an insulating film between two superconductors.

Figure 2:
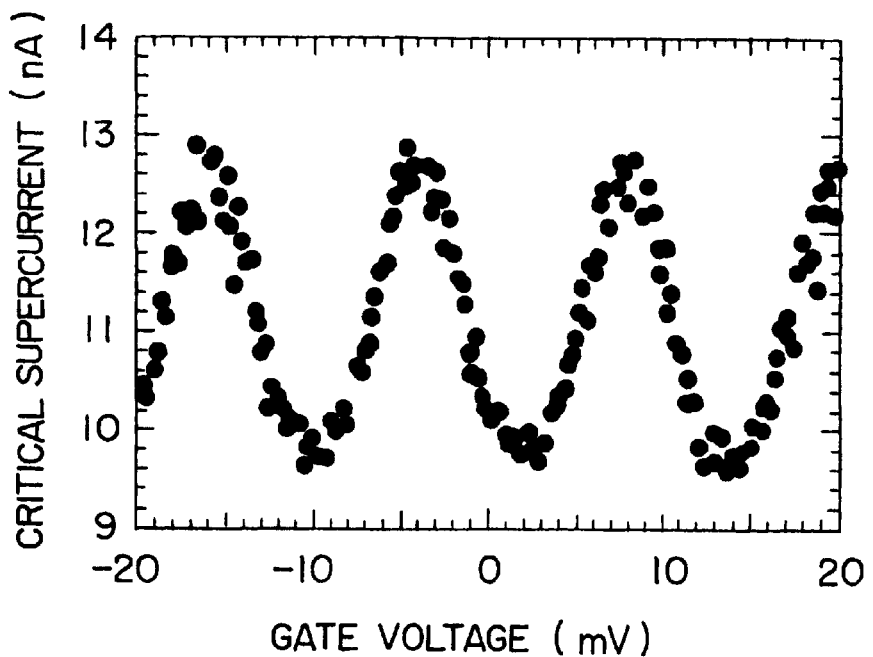
FIG. 2 is a graph showing an example of the basic characteristic of a superconducting single electron transistor employed in the SFQ digital device shown in FIG. 1.

Referring to FIG. 2 showing the basic characteristic of the superconducting SET 2, the critical supercurrent of the superconducting small tunnel junctions 3a and 3b varies according to a gate voltage $V_{in}$ applied to the gate electrode 4. The supercurrent flowing through the superconducting line 1b can be regulated by using this characteristic.

The small tunnel junction device 5 detects a change in the supercurrent flowing through the first superconducting line 1a in a voltage change. More concretely, the small tunnel junction device 5 has one end connected to the point E on the first superconducting line 1a and the other end connected to a power supply that supplies a low bias current of about 10 pA or above. A change in the supercurrent flowing through the first superconducting line 1a causes a change in the output voltage $V_{out}$ of the small tunnel junction device 5. The small tunnel junction device 5 is formed by sandwiching an insulator between a ring and a metal electrode of a superconductor or a normal conductor and has a tunnel resistance far greater than a quantum resistance of 6.4 k$\Omega$.

The operation of the SFQ digital device 10 of the foregoing configuration will be described with reference to FIG. 1.

Suppose that any magnetic field is not applied to the SFQ digital device 10, the number of the fluxoid of the first small ring AEFDA is "1" and the number of the fluxoid of the second small ring EBCFE is "0" in an initial state. In the initial state, the center of magnetic flux lies in the first small ring AEFDA and a supercurrent flows through the first small ring AEFDA and the large ring ABCDA; that is, as shown in FIG. 1, a supercurrent $I_1+I_2$ flows through a path FDAE, a supercurrent $I_1$ flows through a path EF (1b) and a supercurrent $I_2$ flows through a path EBCF.

When the gate voltage $V_{in}$ on the gate electrode 4 of the superconducting SET 2 is changed in this state, the supercurrent $I_1$ on the second superconducting line 1b and the supercurrent $I_1+I_2$ at the point E to which the small tunnel junction device 5 is connected change accordingly. This change is detected in a change of the superconducting energy gap in the small tunnel junction device 5. Therefore, the basic logic of a logic circuit or a storage circuit can be realized by using the relation between an input signal, i.e., the gate voltage $V_{in}$, and an output signal, i.e., output voltage $V_{out}$, through the detection of the output voltage $V_{out}$ of the small tunnel junction device 5, which is very sensitive to the change of the superconducting energy gap at the point E.

Since the superconducting energy gap decreases as the supercurrent flowing through the superconducting line increases, the intensity of the supercurrent can be decided on the basis of the output voltage $V_{out}$.

Figure 3A:
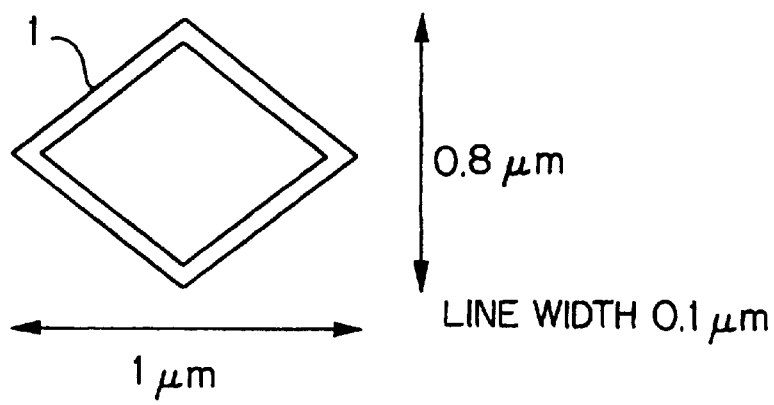
FIGS. 3A and 3B are a diagram and a graph, respectively, showing the dependency of the superconducting energy gap of a superconducting ring of aluminum on the shielding supercurrent for the fluxoid quantum number n=0.
Figure 3B:
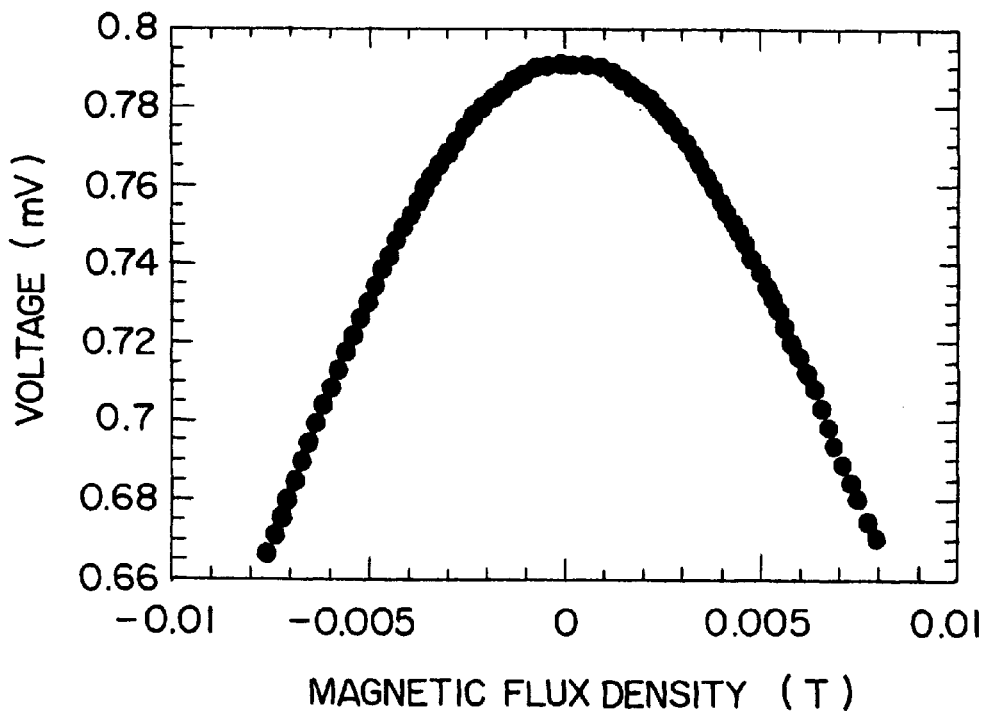

FIGS. 3A and 3B show the results of an experiment conducted to verify the effect of supercurrent on superconducting energy gap. FIG. 3A shows dimensions of an aluminum superconducting ring used in the experiment, and FIG. 3B shows the relation between voltage and magnetic field for a case where the fluxoid quantum number n=0 when the superconducting ring was interposed between two small tunnel junctions and a fixed current of 100 pA was supplied to the superconducting ring through the small tunnel junctions. As obvious from FIG. 3B, source-drain voltage decreases as the intensity of the magnetic field, i.e. shielding supercurrent, increases.

Suppose that the critical supercurrent for the superconducting SET 2 appears in two values expressed by Expressions (2) (2') due to the change of the gate voltage $V_{in}$ on the gate electrode 4.

$$I_0 = \frac{1}{10} \cdot \frac{\Phi_0 a}{\Lambda L} \quad (=C_1) \tag{2}$$

$$I_0 = \frac{3\sqrt{2}}{20} \cdot \frac{\Phi_0 a}{\Lambda L} \quad (=C_2) \tag{2'}$$

where $\Phi_0$ is the flux quantum, a is the cross section of the superconducting line, $\Lambda$ is the London parameter and L is the length of the path. It is supposed that the lengths of all the sides of the first superconducting line 1a and the second superconducting line 1b are L (AE=EB=BC=CF=FD=DA=EF=L), and magnetic flux induced by circulating current flowing along the superconducting line is negligible.

Expressions (4) and (5) can be obtained by applying a fluxoid quantization condition expressed by Expression (3) to the path ABCDA (large ring) and the path AEFDA (first small ring) shown in FIG. 1.

$$\int\int B ds + \oint \Lambda J_s dl = \left(n - \frac{\theta}{2\pi}\right)\Phi_0 \tag{3}$$

$$-\Lambda \cdot \frac{I_1 + I_2}{a} \cdot 3L - \Lambda \cdot \frac{I_2}{a} \cdot 3L = \Phi_0 \tag{4}$$

$$-\Lambda \cdot \frac{I_1 + I_2}{a} \cdot 3L - \Lambda \cdot \frac{I_1}{a} \cdot L = \left(1 - \frac{\theta}{2\pi}\right)\Phi_0 \tag{5}$$

where $J_s$ is supercurrent density, n is fluxoid quantum number, $\theta$ is phase difference between the opposite ends of the superconducting double small tunnel junction device. If the superconducting double small tunnel junction device is not placed in an integration path, $\theta=0$.

The critical supercurrent Io and the supercurrent $I_1$ and the phase difference $\theta$ meets a condition expressed by Expression (6).

$$I_1 = I_0 \sin\theta \tag{6}$$

When $I_0 = C_1$, Expression (7) expressing $\theta$ and $I_1+I_2$ can be obtained from Expressions (4), (5) and (6).

$$\theta = \frac{\pi}{2} \tag{7}$$

$$I_1 + I_2 = -\frac{13}{60} \cdot \frac{\Phi_0 a}{\Lambda L} \approx -0.217 \frac{\Phi_0 a}{\Lambda L}$$

When $I_0 = C_2$, Expression (8) expressing $\theta$ and $I_1+I_2$ can be obtained.

$$\theta = \frac{\pi}{4} \tag{8}$$

$$I_1 + I_2 = -\frac{29}{120} \cdot \frac{\Phi_0 a}{\Lambda L} \approx -0.242 \frac{\Phi_0 a}{\Lambda L}$$

It is known from Expressions (7) and (8) that the supercurrent $I_1+I_2$ at the point E connected to the small tunnel junction device 5 varies according to the variation of the critical supercurrent $I_0$ for the superconducting SET 2.

NOT Gate

Figure 4A:
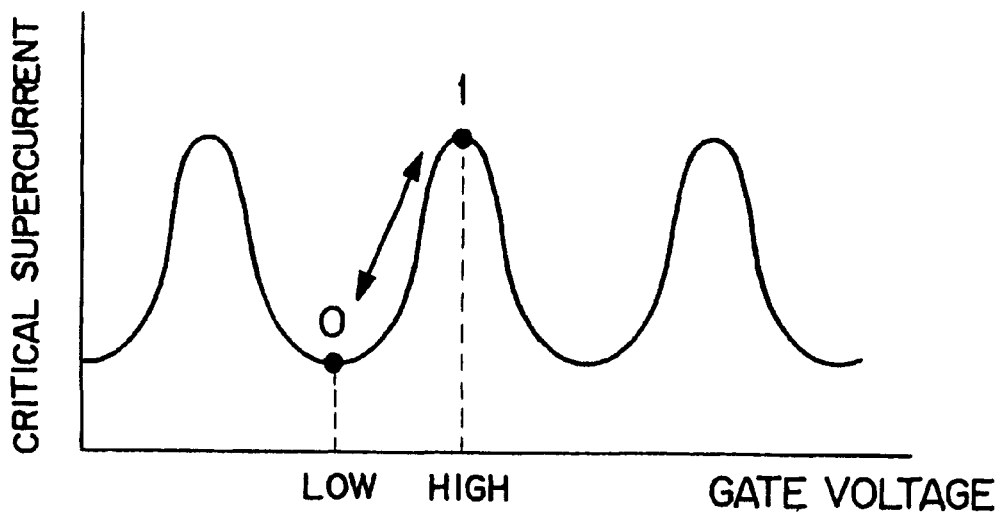
FIGS. 4A and 4B are graphs of assistance in explaining setting a gate voltage to realize a NOT gate and a buffer stage by using the SFQ digital device shown in FIG. 1.

As understood from the foregoing calculations, the following operations are possible when operating points "0" and "1" (a gate voltage at the point "0" is lower than that at the point "1") are set in a section indicating the increase of the critical supercurrent of a characteristic curve showing the relation between the critical supercurrent and the gate voltage $V_{in}$ in the superconducting SET 2 as shown in FIG. 4A. The points "0" and "1" need not be a local minimum and a local maximum as shown in FIG. 4A, but may be any points on a section indicating the increase of the critical supercurrent.

$V_{in}$ is low ("0")→$I_0$ is low→Current at E is low $V_{out}$ is high $V_{in}$ is high ("1")→$I_0$ is high→Current at E is high→$V_{out}$ is low Thus, when the minimum and the maximum of the output voltage $V_{out}$ of the small tunnel junction device 5 are "0" and "1", respectively, the input signal (gate voltage $V_{in}$) and the output signal (output voltage $V_{out}$) can be interrelated by NOT logic and the SFQ digital device 10 can be operated as a NOT gate.

Buffer Stage

Figure 4B:
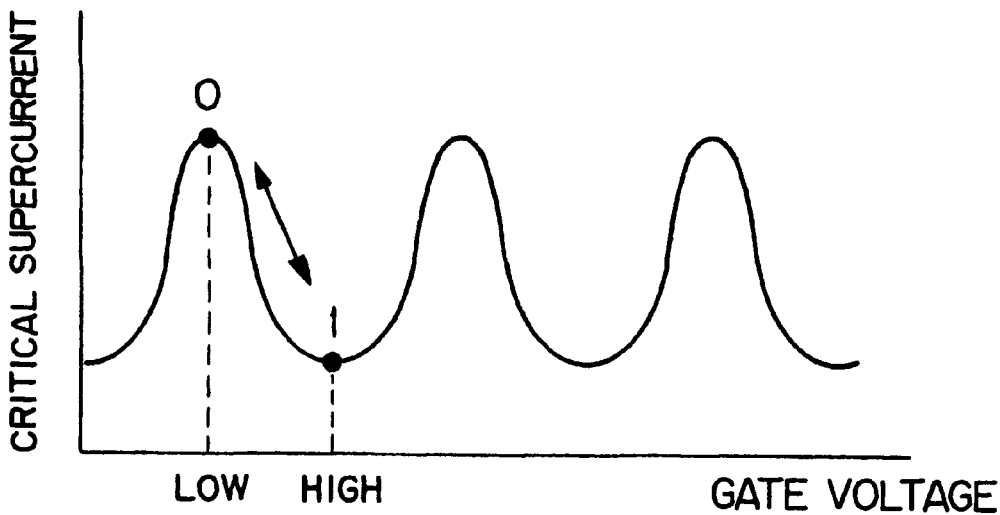
Figure 5:
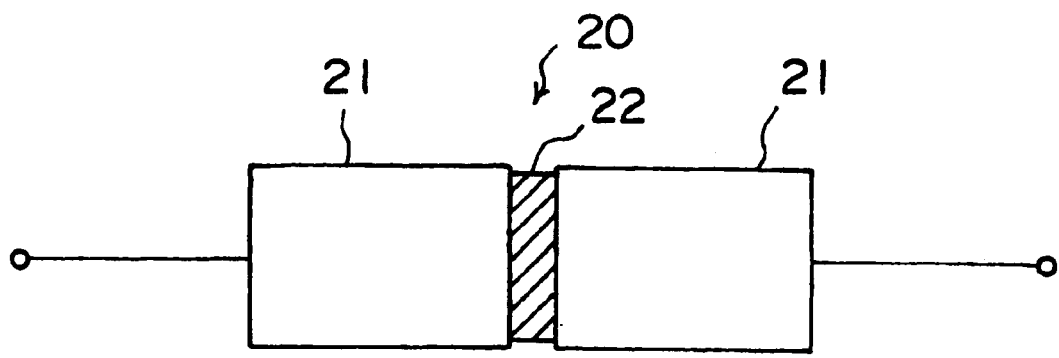
FIG. 5 is a typical view of a Josephson-junction device.
Figure 6:
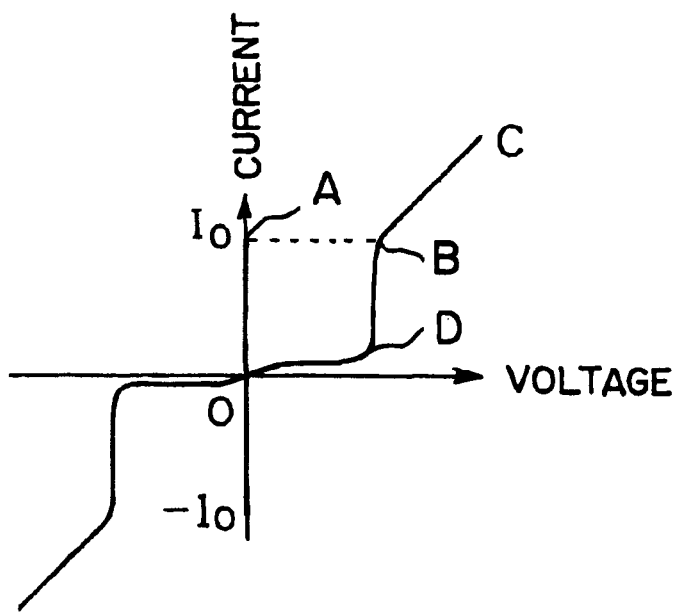
FIG. 6 is a graph showing the current-voltage characteristic of a Josephson-junction device.

When the operating points "0" and "1" are set on a section indicating the decrease of the critical supercurrent of the characteristic curve as shown in FIG. 4B, the following operations are possible. The points "0" and "1" need not be a local maximum and a local minimum as shown in FIG. 4B, but may be any points on a section indicating the decrease of the critical supercurrent.

$V_{in}$ is low ("0")→$I_0$ is high→Current at E is high→$V_{out}$ is low $V_{in}$ is high ("1")→$I_0$ is low→Current at E is low→$V_{out}$ is high Thus, when the minimum and the maximum of the output voltage $V_{out}$ of the small tunnel junction device 5 are "0" and "1", respectively, the input signal (gate voltage $V_{in}$) and the output signal (output voltage $V_{out}$) can be interrelated so as to correspond to a buffer and the SFQ digital device 10 can be operated as a buffer stage.

The gate voltage $V_{in}$ corresponding to the operating point "0" shown in FIGS. 4A and 4B can be easily set and changed if the SFQ digital device 10 is provided with an auxiliary gate electrode 6 (see FIG. 1) in addition to the gate electrode 4.

Objects of application of the SFQ digital device 10 are not limited to NOT gates and buffer stages. The SFQ digital device 10 is applicable to other logic gates including AND gates, OR gates, NAND gates and NOR gates with modification.

As mentioned above, the supercurrent flowing through the second superconducting line 1b changes according to the change of the gate voltage $V_{in}$ on the gate electrode 4 of the superconducting SET 2, and the supercurrent $I_1+I_2$ at the point E connected to the small tunnel junction device 5 changes accordingly. This change of the supercurrent $I_1+I_2$ can be detected through the detection of the change of the output voltage $V_{out}$ of the small tunnel junction device 5 to realize the basic logic of a logic circuit or a storage circuit by using the relation between the input signal (gate voltage $V_{in}$) and the output signal (output voltage $V_{out}$). Particularly, since the SFQ digital device 10 in this embodiment is a three-terminal device capable of raising the level of integration, dealing with the input and output voltage signals, and not having a hysteretic characteristic, circuit design similar to those of conventional semiconductor devices can be easily realized maintaining the characteristics of superconducting digital devices including rapidity and low power consumption.

Since the two small rings AEFDA and EBCFE are substantially the same in shape and area and the small tunnel junction device 5, i.e., the detecting device, is connected to the joint E of the first superconducting line 1a and the second superconducting line 1b, the output voltage $V_{out}$ can be kept constant even if the fluxoid quantum number of either the small ring AEFDA or the small ring EBCFE is 1 owing to the symmetry of the device, provided that the gate voltage $V_{in}$, i.e., the input voltage, is fixed. Accordingly, the SFQ digital device 10 is capable of carrying out stable operations even if the SFQ digital device 10 is used in a high-temperature atmosphere where the state of fluxoid trapping varies.

Although the embodiment described above employs the superconducting SET 2 as a switching device, any suitable voltage-controlled device, such as a Josephson field effect transistor or a MIS field effect transistor, may be employed instead of the superconducting SET 2. The supercurrents that flow through the first superconducting line 1a and the second superconducting line 1b are dependent on the superconductor forming the superconducting lines 1a and 1b, the sectional shape of the superconducting lines 1a and 1b and the areas of the rings of the superconducting lines 1a and 1b. Therefore, to change the output signal greatly according to the change (switching) of the supercurrent, the amplitude of switching must be approximately equal to the current value of the supercurrent flowing through the superconducting line. In the superconducting SET, the amplitude is on the order of 10 nA at the greatest. If a Josephson field effect transistor or a MIS field effect transistor is employed instead of the superconducting SET, the amplitude can be increased. Therefore it is desirable to determine the type and characteristic of the switching device selectively according to the characteristic of the ring.

Although the two small rings AEFDA and EBCFE of the foregoing embodiment are substantially the same in shape and area, the area of the first small ring AEFDA may be greater than that of the second small ring EBCFE, and the fluxoid may be trapped always in the first small ring AEFDA if a small ring having a large area is able to trap the fluxoid stably. If the fluxoid is thus trapped, the device need not be symmetrical and hence the small tunnel junction device 5 may be connected to an optional point on the first superconducting line 1a.

Although the invention has been described in its preferred embodiment with a certain degree of particularity, obviously many changes and variations are possible therein. It is therefore to be understood that the present invention may be practiced otherwise than as specifically described herein without departing from the scope and spirit thereof.

What is claimed is:

1. A single-flux-quantum digital device comprising:
   a first superconducting line extended in a larger ring;
   a second superconducting line connected to the first superconducting line so as to divide the large ring of the first superconducting line into two small rings;
   a switching device that regulates a supercurrent flowing through the second superconducting line; and
   a detecting device that detects a change in the supercurrent flowing through the first superconducting line,
   wherein the two small rings are substantially the same in shape and area; the detecting device is connected to a joint where the first superconducting line and the second superconducting line are joined; and the first superconducting line and the second superconducting line are smaller in width so that magnetic flux induced by the supercurrent circularly flowing along the first superconducting line and the second superconducting line is negligible.

2. The single-flux-quantum digital device according to claim 1, wherein the switching device is a voltage-controlled device that increases the supercurrent flowing through the second superconducting line according to the increase in voltage.

3. The single-flux-quantum digital device according to claim 2, wherein the voltage-controlled device is a superconducting single electron transistor, and the supercurrent flowing through the second superconducting line is increased by increasing a voltage applied to a gate electrode included in the superconducting single electron transistor.

4. The single-flux-quantum digital device according to claim 2, wherein the voltage-controlled device is a superconducting single electron transistor, and the supercurrent flowing through the second superconducting line is decreased by decreasing a voltage applied to a gate electrode included in the superconducting single electron transistor.

5. The single-flux-quantum digital device according to claim 1, wherein the detecting device is a small tunnel junction device for detecting a change in the supercurrent flowing through the first superconducting line in a voltage change.

6. The single-flux-quantum digital device according to claim 1, wherein the switching device is a voltage-controlled device that decreases the supercurrent flowing through the second superconducting line according to the decrease in voltage.

* * * * *